United States Patent
Frosien et al.

(10) Patent No.: US 7,507,956 B2
(45) Date of Patent: Mar. 24, 2009

(54) CHARGED PARTICLE BEAM ENERGY WIDTH REDUCTION SYSTEM FOR CHARGED PARTICLE BEAM SYSTEM

(75) Inventors: Jürgen Frosien, Riemerling (DE); Ralf Degenhardt, Landsham (DE); Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 177 days.

(21) Appl. No.: 10/571,346

(22) PCT Filed: Sep. 2, 2004

(86) PCT No.: PCT/EP2004/009802

§ 371 (c)(1),
(2), (4) Date: Nov. 8, 2006

(87) PCT Pub. No.: WO2005/024890

PCT Pub. Date: Mar. 17, 2005

(65) Prior Publication Data

US 2007/0069150 A1    Mar. 29, 2007

(30) Foreign Application Priority Data

Sep. 11, 2003  (EP)  ................... 03020711
Dec. 16, 2003  (EP)  ................... 03028695

(51) Int. Cl.
| H01J 40/00 | (2006.01) |
| H01J 47/00 | (2006.01) |
| H01J 3/14 | (2006.01) |
| H01J 3/26 | (2006.01) |
| H01J 49/42 | (2006.01) |
| H01J 1/50 | (2006.01) |
| G21K 1/08 | (2006.01) |
| G01K 1/08 | (2006.01) |
| G01N 23/00 | (2006.01) |
| G21K 7/00 | (2006.01) |
| A61N 5/00 | (2006.01) |
| G21G 5/00 | (2006.01) |

(52) U.S. Cl. ................. 250/305; 250/396 ML; 250/396 R; 250/310; 250/311; 250/398; 250/492.1

(58) Field of Classification Search ........... 250/305, 250/310, 311, 396 R, 396 ML, 398, 492.1
See application file for complete search history.

(56) References Cited

U.S. PATENT DOCUMENTS 4,672,204 A    6/1987   Slodzian et al.

(Continued)

FOREIGN PATENT DOCUMENTS

DE    19633496 A1    2/1998

(Continued)

OTHER PUBLICATIONS

Y. Kawanami et al., "Focused Ion Beam System with a Four Stage E x B Mass Filter," Nuclear Instruments and Methods in Physics Research, Holland Publishing Company, Amsterdam, Feb. 1989 vol. B37/38(2): pp. 240-243.

(Continued)

*Primary Examiner*—Jack I Berman
*Assistant Examiner*—Brooke Purinton
(74) *Attorney, Agent, or Firm*—Patterson & Sheridan, L.L.P.

(57) ABSTRACT

The present invention provides a charged particle beam energy width reduction system. The system comprises a first element acting in a focusing and dispersive manner in an x-z-plane; a second element acting in a focusing and dispersive manner in the x-z-plane; a charged particle selection element positioned between the first and the second element acting in a focusing and dispersive manner; and a focusing element positioned between the first and the second element acting in a focusing and dispersive manner.

49 Claims, 11 Drawing Sheets

U.S. PATENT DOCUMENTS

| | | | |
|---|---|---|---|
| 4,769,543 A * | 9/1988 | Plies | 250/310 |
| 4,810,880 A * | 3/1989 | Gerlach | 250/305 |
| 4,962,313 A | 10/1990 | Rose | |
| 5,324,953 A * | 6/1994 | Yoshitake et al. | 250/557 |
| 6,246,058 B1 * | 6/2001 | Tiemeijer | 250/396 R |
| 6,614,026 B1 * | 9/2003 | Adamec | 250/398 |
| 6,960,763 B2 * | 11/2005 | Lopez et al. | 250/305 |
| 6,410,924 B1 | 8/2006 | Wang | |
| 2002/0104966 A1 | 8/2002 | Plies et al. | |
| 2004/0188630 A1 | 9/2004 | Brunner et al. | |

FOREIGN PATENT DOCUMENTS

| | | |
|---|---|---|
| DE | 10122957 A1 | 11/2002 |
| EP | 0373399 A2 | 6/1990 |
| EP | 1432006 A2 | 6/2004 |
| JP | 01264149 | 10/1989 |

OTHER PUBLICATIONS

European Examination Report dated Jul. 6, 2006.

X.D. Liu et al., "Aberration analysis of Wien filters and design of an electron energy-selective imaging system," Nuclear Instruments and Methods in Physics Research A, Sep. 1995 vol. 363(1): pp. 254-260.

* cited by examiner

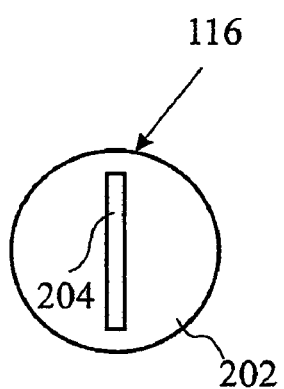
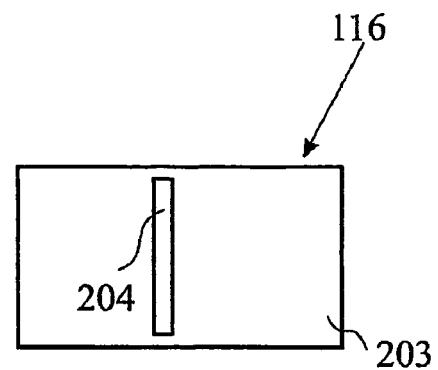
Fig. 2a                    Fig. 2b
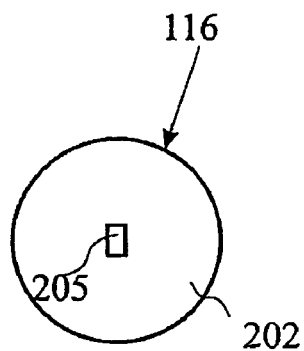
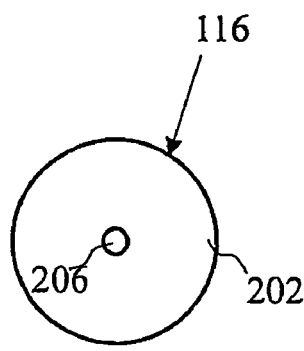
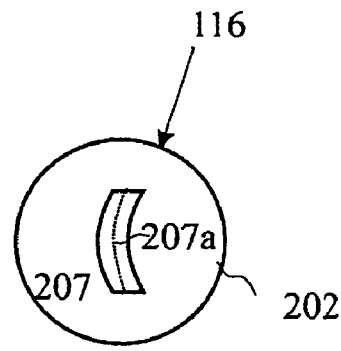
Fig. 2c          Fig. 2d          Fig. 2e
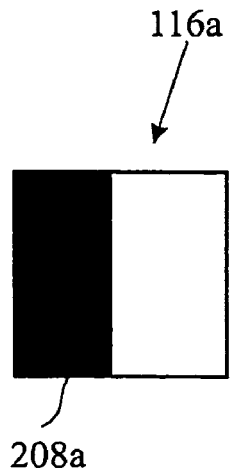
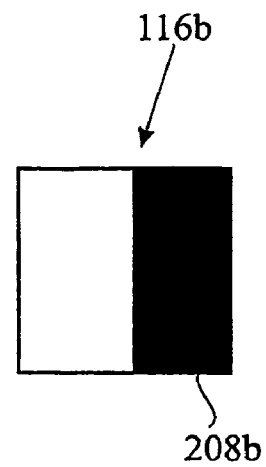
Fig. 3a                    Fig. 3b

CHARGED PARTICLE BEAM ENERGY WIDTH REDUCTION SYSTEM FOR CHARGED PARTICLE BEAM SYSTEM

CROSS-REFERENCE TO RELATED APPLICATIONS

This application claims foreign priority benefits under 35 U.S.C. §119 to co-pending European patent application numbers EP 03020711.2, filed Sep. 11, 2003, and EP 03028695.9, filed Dec. 16, 2003. These related patent applications are herein incorporated by reference in their entireties.

FIELD OF THE INVENTION

The invention relates to charged particle beam devices for inspection system applications, testing system applications, lithography system applications and the like. It also relates to methods of operation thereof. Further, the present invention relates to charged particle selection systems. Specifically, the present invention relates to charged particle beam energy width reduction systems, charged particle beam devices and methods of operating charged particle beam energy width reduction systems and charged particle beam devices.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

However, in modern low voltage electron microscopes, aberrations limit the achievable resolution to approximately 3 nm for 1 keV electron energy. Especially for low energy application, it is therefore desirable to reduce chromatic aberrations. The diameter of the aberration disc of the chromatic aberration in the Gaussian image plane of an objective is proportional to the relative energy width $\Delta E/E$ of the charged particle beam.

The electrons in an electron beam column are not monochromatic because of the emission process and the Boersch effect, that is, the broadening of the energy distribution because of stochastic Coulomb interaction so that the relative energy width is increased. In view of the above, the energy width $\Delta E$ amounts to approximately 0.5 to 1 eV in dependence upon the beam current.

A farther minimization of the chromatic aberration based on the focusing properties of, for example, the objective lens is difficult. For this reason, it is already known, in order to further increase the resolution, to utilize monochromators. Thereby, the energy width $\Delta E$ of the electron beam, which is processed subsequently by the downstream electron-optical imaging system, can be reduced.

When filters are known as monochromators for charged particles wherein an electrostatic dipole field and a magnetic dipole field are superposed perpendicularly to each other.

As an example, patent publication US 2002/0104966 (Plies et al.) describes a monochromator including a plurality of Wien filters defining an optical axis and being arranged serially one behind the other in the direction of propagation. Thereby, the monochromator exhibits four Wien filters arranged in series, one behind the other, of which one portion is rotated azimuthally by 90° about the optical axis relative to the other Wien filters. However, there is still a necessity to simplify even further the configurations.

In another example, "MIRAI" Analytical Electron Microscope—Performance of the Monochromator, Mukai et al., Conference Proceedings Microscopy & Microanalysis 2003 (San Antonio, Tex., USA), a monochromator including two octapole type Wien filters and slit that is positioned between the two Wien filters is disclosed. The first Wien filter is about twice as long as the second Wien filter. Independent of whether or not the characteristics of this monochromator has improved with regard to other prior art systems, a variable adjustment of the dispersion is difficult to realize with the described system.

SUMMARY OF THE INVENTION

The present invention provides an improved charged particle system. Thereby, the resolution of the system is intended to be improved. According to aspects of the present invention, a charged particle beam energy width reduction system according to independent claims 1 and 27, a charged particle beam device according to claim 33 and a method of operating a charged particle beam energy width reduction system according to independent claims 35 and 43 are provided.

According to one aspect of the present invention, a charged particle beam energy width reduction system for a charged particle beam is provided. The system comprises a first Wien filter element. The first Wien filter element focuses the charged particles beam in the x-z-plane and deflects the charged particles depending on their energy. The system comprises a second Wien filter element. The second Wien filter element focuses the charged particles beam in the x-z-plane and deflects the charged particles depending on their energy. Further, the system comprises a charged particle selection element and a focusing element. The charged particle selection element and the focusing element are positioned along the optical axis of the system between the first and the second Wien filter element.

The above system is easy to align due to the limited number of components required. The energy width of the primary charged particle beam can be reduced.

Within this application the energy width reduction element is also denoted as a monochromator. The term monochromator in the present application is not to be understood as selecting a single energy of the charged particles, instead as filtering the primary charged particle beam to obtain a desired energy width.

Within the present application, instead of a Wien filter element, also other elements acting in a focusing and dispersive manner in one plane can be used.

According to another aspect, the charged particle selection element and the focusing element are positioned along the optical axis of the system (z-position) essentially in the middle between the first and the second Wien filter element. Thereby, the term essentially is preferably understood as including a ±5%-tolerance of the distance in z-direction between the first and second Wien filter element. According to preferred aspect, the first Wien filter element has a z-position $z_1$, the second Wien filter element has a z-position $z_2$ and the charged particle selection element and the focusing element have z-positions $(z_1+z_2)/2$. The symmetry, which should essentially be obtained, leads to a stigmatically, dispersion free imaging, which is capable of reducing aberrations.

Within this application, the position of the Wien filter elements is defined by the center of the field region or the center of the Wien filter element. A comparable definition is used for the position of the quadrupole elements.

According to yet another aspect, the first and the second Wien filter element have symmetrical mechanical design with regard to the center plane of the system. Thereby, the symmetry can be further established.

In view of the above-described symmetry aspects, the dispersion of the charged particles after passing through the system is cancelled out.

According to another aspect, a charged particle beam energy width reduction system with a charged particle selection element is provided. The charged particle selection element selects the charged particles depending on the charged particle energy. It is a charged particle energy dependent selection element. According to an even further aspect the charged particle selection element is a slit.

Thereby, the charged particle selection element can be fixedly mounted or it can be movable. Further, it can have a variable selection width or a fixed selection width.

According to a further embodiment, the focusing element is suitable for focusing in the y-z-plane. Thereby, the astigmatic focusing in the y-z-plane and the imaging of the Wien filter elements in the x-z-plane result in a stigmatic imaging.

According to an even further aspect, the focusing element is a cylinder lens in decel mode. Due to the deceleration of the charged particles in the system, the dispersion is increased. Thus, the energy width can be further decreased.

According to another aspect, the charged particle beam energy width reduction system further comprises a first quadrupole element focusing the charged particle beam in the x-z-plane and a second quadrupole element focusing the charged particle beam in the x-z-plane. According to an even further aspect, the first quadrupole element is positioned so that the field of the first quadrupole element essentially superimposes (overlaps) with the field of the first Wien filter element; and the second quadrupole element is positioned so that the field of the second quadrupole element essentially superimposes with the field of the second Wien filter element.

Thereby, the focusing of the Wien filter elements and the focusing of the quadrupole elements combine. Thus, the excitation of the Wien filter element can be reduced as the excitation of the quadrupole element is increased so that the combined focusing effect remains essentially similar. Reducing the excitation of the Wien filter element reduces the dispersion. Thereby, the energy width and/or the charged particle beam current can be adjusted.

Alternatively thereto, according to another aspect, the first quadrupole element defocuses the charged particle beam in the x-z-plane and the second quadrupole element defocuses the charged particle beam in the x-z-plane. Thus, the combined focusing effect can be maintained at a desired level by further increasing the focusing effect of the Wien filter elements. The increased focusing effect of the Wien filter elements results in a further increased dispersion.

According to another aspect, a charged particle beam energy width reduction system is provided. The system includes a first Wien filter element acting in a focusing and dispersive manner in an x-z-plane and having a first z-position $z_1$, a second Wien filter element acting in a focusing and dispersive manner in the x-z-plane and having a second z-position $z_2$, a charged particle selection element with a z-position essentially in the middle of $z_1$ and $z_2$, a first quadrupole element acting in a defocusing manner in an x-z-plane, and a second quadrupole element acting in a defocusing manner in an x-z-plane. The first Wien filter element, the second Wien filter element, the first quadrupole element, the second quadrupole element, and the charged particle selection element are positioned to allow a stigmatic and dispersion-free imaging of the trespassing charged particles.

According to another aspect, the first and the second Wien filter elements, the first and the second quadrupole elements and the charged particle selection element are positioned essentially symmetrically with regard to the center plane of the system.

According to another aspect, the respective Wien filter element and the respective quadrupole element can be combined in one multipole element. Thereby, the above-described system can be realized without increasing the number of components that have to be aligned with respect to each other.

According to another aspect, a charged particle beam device for inspection, testing, pattern generation or lithography is provided. The charged particle beam device comprises a charged particle beam energy width reduction system according to any of the above-described aspects.

According to an even further aspect, the charged particle beam energy width reduction system is position within the charged particle beam column so that a magnification lens illuminates the charged particle beam energy width reduction system.

According to another aspect a charged particle beam energy width reduction system is provided. The energy width reduction system includes a first Wien filter element acting in a focusing and dispersive manner in an x-z-plane and having a first z-position $z1$, a second Wien filter element acting in a focusing and dispersive manner in the x-z-plane and having a second z-position $z2$, a charged particle selection element with a z-position between $z1$ and $z2$, a first quadrupole element acting in a defocusing manner in an x-z-plane, a second quadrupole element acting in a defocusing manner in an x-z-plane. Thereby, the first Wien filter element, the second Wien filter element, the first quadrupole element, the second quadrupole element, and the charged particle selection element are positioned to allow a stigmatic and dispersion-free imaging of the trespassing charged particles.

According to another aspect, a method of operating an energy width reduction element is provided. The method comprises the steps of: providing a first Wien filter element acting in a focusing and dispersive manner in an x-z-plane at a z-position $z_1$, providing a second Wien filter element acting in a focusing and dispersive manner in an x-z-plane at a z-position $z_2$, and providing an energy selection element with a z-position essentially in the middle of $z_1$ and $z_2$. Further, the first Wien filter element is excited so that charged particles with a nominal energy pass through the energy selection element and the second Wien filter element is excited so that the combination of the field of the first Wien filter element and the field of the second Wien filter element result in an essentially stigmatic and essentially symmetric imaging of the charged particle beam. Even further, the charged particles are selected with the charged particle selection element.

According to a further aspect, a method further comprising the following steps is provided. That is, providing a focusing element with a z-position essentially in the middle of $z_1$ and $z_2$ and exciting the focusing element so that an essentially stigmatic imaging of the charged particle beam is obtained.

According to another aspect, the first Wien filter element is excited so that the charged particles with a nominal energy pass through the energy selection element and pass through the central y-axis of the focusing element.

According to another aspect, a method of operating an energy width reduction element is provided. Thereby, a first and a second Wien filter element acting in a focusing and dispersive manner in an x-z-plane, an energy selection element positioned between the first and the second Wien filter element, and a focusing element positioned between the first and the second Wien filter element are provided. The first Wien filter element is excited so that charged particles with a nominal energy pass through the energy selection element and the center of the focusing element. The second Wien filter is excited; further, the focusing element is excited so that an essentially stigmatic imaging of the charged particle beam is obtained. As a result, charged particles can be selected with the charged particle selection element.

With the present application the beam direction corresponds to the z-axis. Unless otherwise noted, the term "length of a field (region)" or "length of a component" is used describe the dimension in z-direction.

According to an even further aspect, the charged particles are selected depending on their energy.

Yet, according to another aspect, a first and a second quadrupole element are provided. These elements are excited to provide a combined focusing effect with the first Wien filter element and to provide a combined focusing effect with the second Wien filter element, respectively. Further, the focusing element is excited to retain the stigmatic imaging of the system.

For the combined focusing effect, the focusing effect of the Wien filter elements can either be substituted by focusing of the quadrupole elements or additional focusing of the Wien filter elements is required due to defocusing of the quadrupole elements.

According to another aspect, a method can be applied to either adjust the dispersion depending on the excitation of the Wien filter elements in relation to the excitation of quadrupole elements or to adjust the beam current depending on the excitation of the Wien filter elements in relation to the excitation of quadrupole elements.

The above aspects can be used to adjust the dispersion and the resulting characteristics without varying the position and/or the selection width of the energy selection element.

According to another aspect, the focusing element used for the charged particle beam energy width reduction system or the method of operation of this system is one element selected from the group of: magnetic round lens, electrostatic round lens, compound electrostatic-magnetic round lens, a magnetic cylinder lens, an electrostatic cylinder lens, a magnetic quadrupole element, an electrostatic quadrupole element or any combination of all of these elements, especially a compound electrostatic-magnetic quadrupole element or a compound electrostatic-magnetic cylinder lens.

According to another aspect, the energy width reduction system is a retarding field energy width reduction system. Thereby, according to one alternative, the Wien filter elements have a higher potential as the focusing element. According to another alternative, immersion lenses may be provided before the first Wien filter element and after the second Wien filter element, respectively. The immersion lenses can be used for retarding the charged particle beam in the retarding field energy width reduction system and accelerating the charged particle beam thereafter.

According to another aspect, the focusing element of the energy width reduction system may comprise two sub-units. According to an even further aspect the two sub-units are symmetrically positioned and designed with regard to the x-y-center plane of the system. The sub-units allow simplified mounting and maintenance of the charged particle selection element.

The invention is also directed to apparatus for carrying out the disclosed methods, including apparatus parts for performing each of the described method steps. These method steps may be performed by way of hardware components, a computer programmed by appropriate software, by any combination of the two, or in any other manner. Furthermore, the invention is also directed to methods by which the described apparatus operates or is manufactured. It includes method steps for carrying out every function of the apparatus or manufacturing every feature of the apparatus.

BRIEF DESCRIPTION OF THE DRAWINGS

Some of the above indicated and other more detailed aspects of the invention, will be described in the following description and partially illustrated with reference to the figures. Therein:

FIGS. 2a to 2e show schematic views of embodiments of electron selection elements;

FIGS. 3a to 3b show schematic side views of further embodiments of electron selection elements;

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image. Further, within the present application, if a hardware component is referred to as acting in a certain manner, it is to be understood that this hardware component is suitable for acting in this manner.

Those skilled in the art would also appreciate that all discussions herein related to an x-z- and y-z-plane, are to be understood that the planes are essentially perpendicular to each other. Even though theoretical discussions in this application refer to coordinates in a mathematical sense, the respective components can practically be positioned with respect to each other so that the x-z- and y-z-plane enclose an angle of about 80° to 100°, preferably 87° to 93°, more preferably of about 89° to 91°.

Further, without limiting the scope of protection of the present application, in the following, the charged particle beams will be referred to as primary charged particle beams. The present invention might still be used for secondary and/or backscattered charged particles. Thereby, for example, the energy distribution of charged particles in an imaging optics can be controlled.

Within the following description of the drawings the same reference numbers refer to the same components. Generally, only the differences with respect to the individual embodiments are described.

Figure 1A:
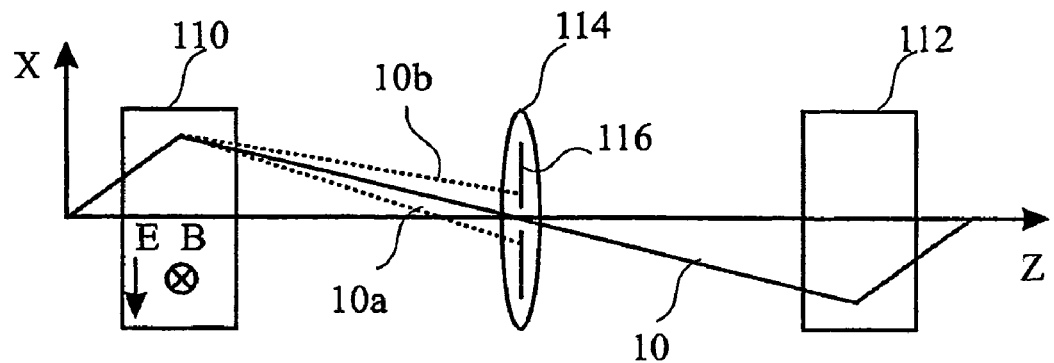
FIG. 1a shows a schematic view of a first embodiment of an electron beam energy width reduction system in the x-z-plane.
Figure 1B:
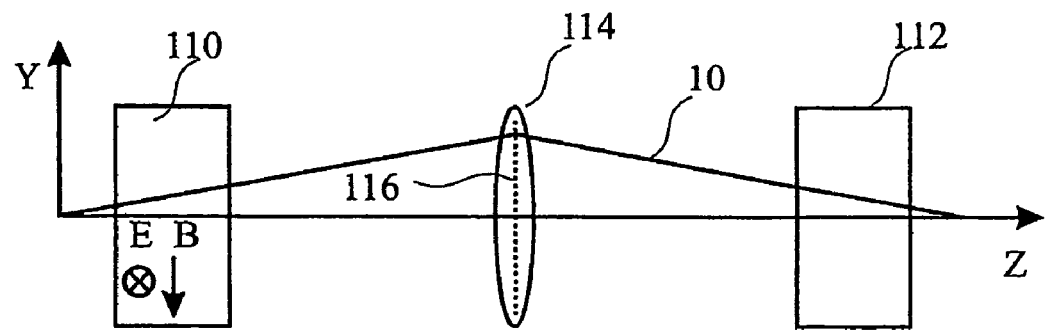
FIG. 1b shows a schematic side of the embodiment of FIG. 1 a in the y-z-plane.

FIGS. 1a and 1b show one embodiment from two different perspectives. The optical axis of the system is given by the z-axis. FIG. 1a shows a view in an x-z-plane, whereas FIG. 1b shows a view in a y-z-plane. The system comprises a first Wien filter element 110, a second Wien filter element 112, a focusing element 114 and an electron selection element 116. Reference number 10 denotes the beam path of an exemplary electron beam with a nominal energy $E_n$. FIG. 1a further shows two beam paths 10a and 10b with energies deviating from the nominal energy.

The influence on beam 10 with nominal energy $E_n$ in the x-z-plane will now be described. Wien filter element 110 focuses the electron beam 10, which starts on the z-axis (optical axis). The Wien filter element 110 comprises an electrostatic dipole and a magnetic dipole, that is perpendicular to the electrostatic dipole. Since this arrangement of an electrostatic and magnetic dipole only acts on the electron beam in the x-z-plane, it is referred to Wien filter 110 as a dipole Wien filter. The properties of such a dipole Wien filter is described in more detail elsewhere.

Due to the focusing action of Wien filter element 110, the electron beam crosses the optical axis. Wien filter element 112, which lies—regarding the z-position—symmetrically to Wien filter element 110 and which is symmetrically excited to Wien filter element 110, focuses the electron beam 10 back towards the optical axis.

Focusing element 114 and an electron selection element 116 are positioned essentially at the intersection of the electron beam 10 and the optical axis. Due to the symmetry of Wien filter elements 110 and 112 this position is—regarding the z-position—essentially in the middle of the two Wien filter elements. Thus, electron selection element 116 is positioned at an astigmatic intermediate image and can therefore be considered an electron energy dependent selection element.

In the embodiment of FIG. 1, the focusing element 114 is, for example, a round lens and the electron selection element 116 is a slit extending in y-direction in the y-z-plane. Since the electron beam passes through the lens 114 in the y-z-plane, there is no, or hardly any, focusing acting in x-direction. Thus, the electron beam passes through the focusing element 114 without being focused in x-direction. Further, the electron beam passes through slit 116.

Wien filter element 110 has, besides the focusing effect, a dispersive effect. This dispersive effect causes Wien filter 110 to locally separate electrons with an energy different from the nominal energy $E_n$ from electrons with nominal energy $E_n$. In FIG. 1a this is indicated by electron beams 10a and 10b. Beam 10a has an energy lower than the nominal energy. In contrast thereto, beam 10b has an energy higher than the nominal energy. The local separation of electrons with different energies allows the electron selection element 116 to block electrons with at least a defined deviation from $E_n$. Thus, the width of the energy distribution of the electron beam is decreased. Regarding the characteristics of a charged particle beam device making use of the energy width reduction, the decreased energy width $\Delta E$ results in reduced chromatic aberrations. Thus, the resolution of the system can be improved.

Since the optical system described above reduces the electron energy width, the system with a first Wien filter element 110, a second Wien filter element 112, a focusing element 114 and an electron selection element 116, can be considered a monochromator.

The effect of the monochromator in y-direction will now be described with respect to FIG. 1b. As describe above, Wien filter elements 110 and 112 are dipole Wien filters acting in a focusing and dispersive manner in x-direction. In y-direction neither the Wien filter element 110 nor the Wien filter element 112 influences the electron beam 10. Electron beam 10 passes straight through elements 110 and 112. The focusing element 114 focuses the electron beam 10 back towards the optical axis (z-axis).

In view of the above, there is an imaging in x-z-plane (see elements 110 and 112) and there is an imaging in y-z-plane (see element 114). In summary, the beam is stigmatically imaged. Additionally to the focusing effect, there is the dispersion in x-direction, which is introduced by Wien filter elements 110, 112. Thereby, the electrons deviating to at least a certain amount from the nominal energy $E_n$ can be blocked with slit 116.

As can be seen from the above description referring to FIGS. 1a and 1b, the monochromator is a straight vision system. Thereby, the optical axis and the z-axis coincide. The systems disclosed within this application are preferably and independent of specific embodiments, without limiting the invention thereto, straight vision systems. Nevertheless, the present invention may also be used for non-straight vision systems.

One advantage of a non-straight vision system can be the following. In the presence of e.g. ionized molecules, which are accelerated in direction of the emitter, these ions could damage the emitter on impingement thereon. Utilizing a non-straight vision system, the ions would not impinge on the emitter because a possible beam curvature differs from e.g. electrons to ions. FIGS. 2a to 3b show different examples for embodiments of the electron (energy dependent) selection element 116. Since the focusing effect of the Wien filter elements is conducted in an x-z-plane, the electron selection element preferably has the form of a slit. Respective embodiments are shown in FIGS. 2a and 2b. FIG. 2a shows a round disc element 202 with a slit aperture 204. Within the monochromator, the slit would extend in y-direction. Thereby, electrons with the nominal energy could pass through the center of the slit independent of the displacement from the optical axis in y-direction. Non-nominal energy electrons would be deflected in x-direction and would thus be blocked by the disc element 202.

Within FIG. 2b the slit 204 is unamended with respect to FIG. 2a. However, the disc element 202 of FIG. 2a is replaced by a solid rectangular element 203. As the case may be, each of the two embodiments can be preferred for adjustment, attachment, manufacturing or other reasons.

The slit aperture 204 may for example be used to avoid contaminated regions of the slit. In the case where a region of the slit is contaminated, the electron selection element can be displaced in y-direction. Thereby, a different region of the slit aperture 704 may be used, which is not contaminated.

FIG. 2c shows an electron selection element 116 with a disc element 202 and a short slit 205. Slit 205 has in x-direction the same dimension as slit 204. Therefore, slit 205 would conduct a similar energy selection than slit 204. However, slit 205 has a smaller extension in y-direction. Therefore, electrons which pass through the slit need to have less deviation from the optical axis in y-direction. In view of the above, electron selection element 116 of FIG. 2c can be considered an electron energy depending and angle depending selection element. Aperture means 116 select the electrons energy depending in x-direction an angle depending in y-direction.

Similarly to the shortened slit 205 of FIG. 2c, aperture 206 in FIG. 2d is a further diminished extension of a slit resulting in a round aperture. Again, an energy-selection of the electrons takes place corresponding to the extension in x-direction, whereas an angle-selection of the electrons takes place corresponding to the y-direction. The round shape of the aperture might for example be used for manufacturing reasons.

Another exemplary embodiment for an electron selection element 116 is shown in FIG. 2e. Again, there is a round disc 202 with an opening 207. Aperture opening 207 is formed as a curved slit. Reference number 207a denotes the centerline of the curved slit 207. The curvature of the slit takes into account aberrations of the dispersive Wien filter element. The dispersion of the Wien filter element might depend upon the distance of the electrons from the optical axis in y-direction. Thus, electrons having a different distance from the optical axis in y-direction might be deflected differently depending on their energy. Consequently, the center line 207, which corresponds to the nominal energy $E_n$, has a curvature depending on the distance from the optical axis in y-direction. The slit 207 is curved accordingly.

Further embodiments are described with respect to FIGS. 3a and 3b. All above described embodiments had at least an electron selection in positive x-direction and in negative x-direction. However, it is also possible to provide an electron selection means, a knife edge, that only blocks electrons deviating from the nominal beam path in one of either positive or negative x-direction. Thereby, only one edge limiting the electron beam is provided. Element 116a and 116b are two examples. Each of which has a solid part 208a or 208b, respectively. All electrons passing on the right side of solid part 208a are not blocked. All electrons passing on the left side of solid part 208b are not blocked.

The components of FIGS. 3a and 3b can be used for different embodiments. Thereby, the components can be used separately or they can be combined. A first embodiment making use of one of the components of FIG. 3a or 3b will now be described. Depending on the side of the electron energy spectrum that should be blocked, either electron selecting element 116a or 116b can be used. Nevertheless, an electron selecting edge could only block a low-energy or a high-energy part of the electron energy spectrum. This night however be sufficient as will be described in the following.

As described with respect to the state of art, it is for example desirable to reduce the energy width of the primary electron beam. The energy width is thereby mainly influenced by the emitter characteristic. Consequently, the desired energy selection depends on the emitter characteristic. Some emitters, like Schottky emitters or cold-field emitters, have an asymmetric emitting spectrum. That is, the energy spectrum of the emitted electrons has a steep flank on one side of the emission peak, whereas the other side of the peak the spectrum has a tail-like shape. The tail-like shape of one side of the emission spectrum dominates the energy width $\Delta E$. Thus, in the case where the tail of the spectrum is blocked, the energy width $\Delta E$ can be sufficiently decreased. In view of the above, it can be sufficient to only use an edge to select electrons.

A second embodiment making use of both components of FIGS. 3a and 3b will now be described. The two electron selection elements are positioned to be—in z-direction—neighboring elements. Thus, each element is used to select electrons depending on the deviation from nominal energy. By combining the two elements a slit comparable to slit 204 is formed. However, providing two separate components might be used because of easier maintenance, reduced tendency to contamination, or the like.

A third embodiment making use of both components of FIGS. 3a and 3b will now be described. Additionally, the second embodiment, described above, can be diversified as follows. In the case, where two separate electron selection elements 116a and 166b are used, each element can be adjusted independently of each other.

Describing the previously mentioned electron energy dependent selection elements no reference was made to any adjustment of the energy width $\Delta E$. The system described with respect to FIGS. 1a and 1b provides the opportunity to adjust the electron energy width $\Delta E$ by adjusting the width of the electron selection element 116 in x-direction. All embodiments described above might be equipped with aperture width variation means. Alternatively, electron selection elements, each having fixed aperture width, might be exchangeable in order to select the electron energy width.

According to further embodiments (not shown) the electron selection elements might alternatively or additionally be movable.

The currently described embodiment referring to FIGS. 3a and 3b provides the opportunity to more easily adjust the edges of the electron selection elements and, further still, to easily adjust the selection elements independently of each other.

Further, according to another embodiment (not shown) which relates to FIGS. 3a and 3b, it is possible to adjust the shape of the edges of the electron selection elements similarly to the shape of slit 207 or to use other shapes of edges.

Figure 4A:
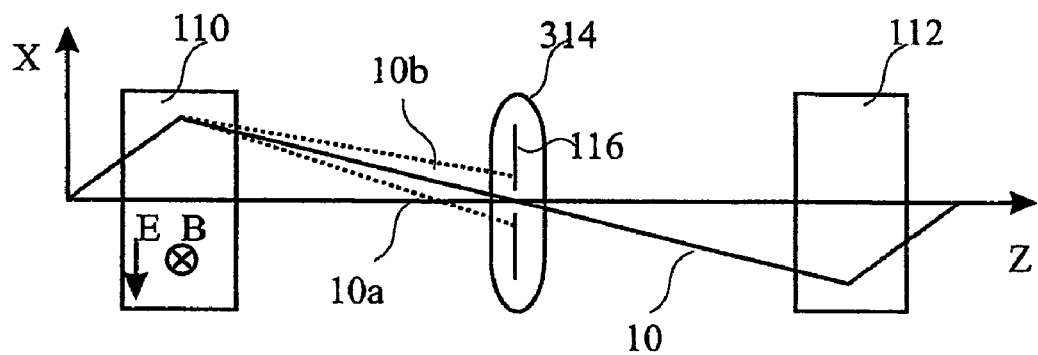
FIGS. 4a, 4b show schematic side views of another embodiment of an electron beam energy width reduction system according to the present invention.
Figure 4B:
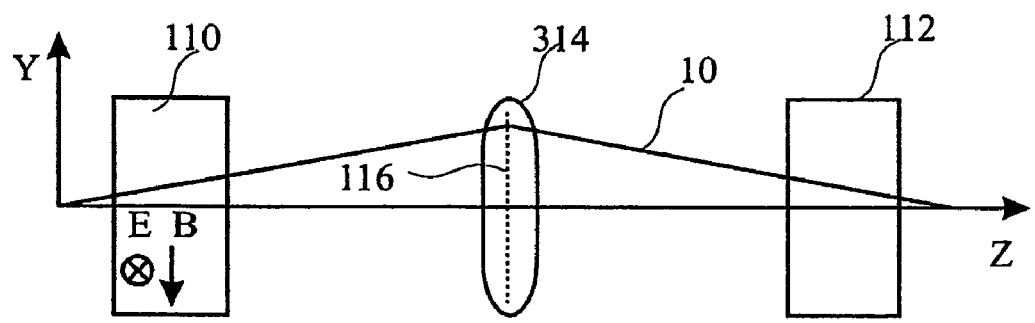

FIG. 4a shows another embodiment from two different perspectives. The optical axis of the system is given by the z-axis. FIG. 4a shows a view in an x-z-plane, whereas FIG. 4b shows a view in a y-z-plane. As compared to FIGS. 1a and 1b, the subject embodiment uses a different focusing element 314. The focusing element used here is an astigmatic focusing element. Since the focusing effect in x-direction for example of a round lens does not influence electron beam 10 that passes through the center of the focusing element, a focusing effect in x-direction may as well not be present. Consequently, the subject embodiment utilizes an astigmatic focusing element 314. Without limiting the invention thereto, a quadrupole element 314 as symbolized in FIGS. 4a and 4b can be used.

Similarly to the embodiment of FIG. 1, focusing element 314 does not influence the electron beam in x-direction. However, in y-direction there is a focusing action so that the imaging of the Wien filter elements 110 and 112 in x-direction and the imaging of the quadrupole element 314 in y-direction jointly result in a stigmatic imaging of the electron optical system.

A further embodiment will now be described with respect to FIGS. 5a to 5d. Thereby, FIGS. 5a to 5c show a monochromator in the x-z-plane, whereas FIG. 5d is a view in the y-z-plane.

Figure 5A:
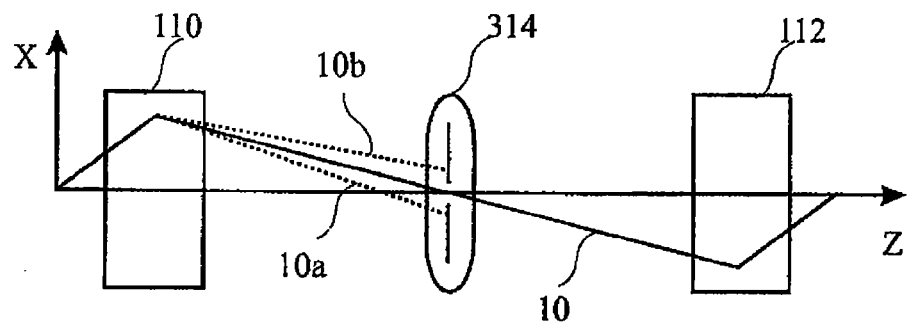
FIG. 5a to 5c show schematic side views of other embodiments of electron beam energy width reduction systems according to the present invention; the views are shown in the x-z-plane.

FIG. 5a is similar to FIG. 1a The system comprises a first Wien filter element 110, a second Wien filter element 112, a focusing element 114 and an electron selection element 116. Reference number 10 denotes the beam path of an exemplary electron beam with a nominal energy $E_n$. FIG. 1a further shows two beam paths 10a and 10b with energies deviating from the nominal energy.

Wien filter element 110 focuses the electron beam 10, which starts on the z-axis (optical axis). The Wien filter element 110 comprises an electrostatic dipole and a magnetic dipole, which is perpendicular to the electrostatic dipole.

Figure 5B:
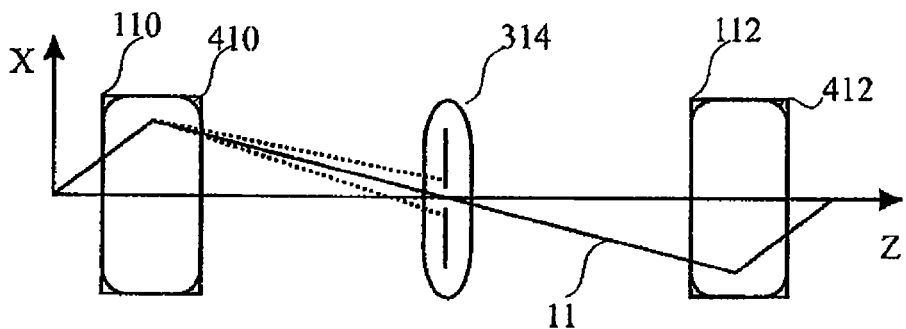
Figure 5C:
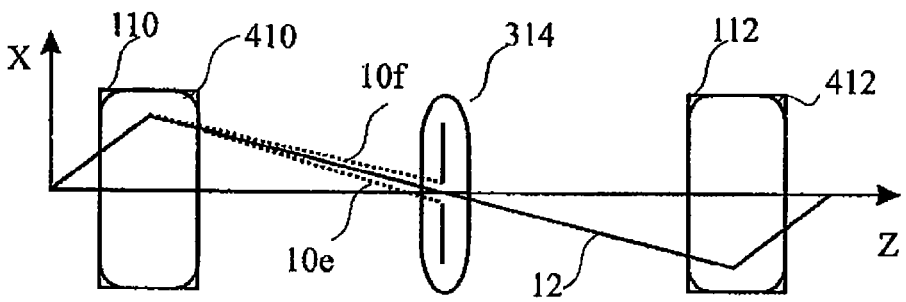
Figure 5D:
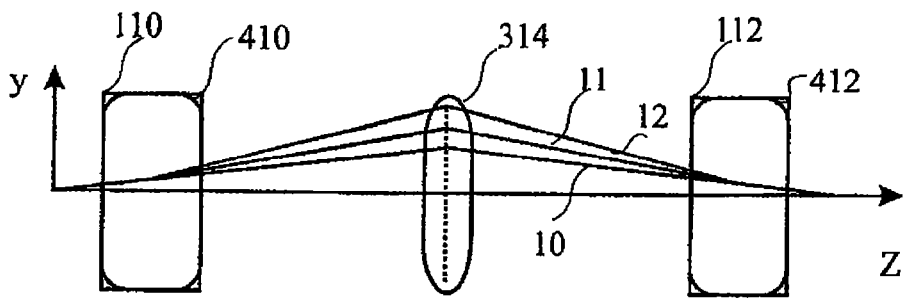
FIG. 5d shows a schematic side view the embodiments of FIGS. 5a to 5c in the y-z-plane.

FIG. 5b shows an embodiment wherein additional quadrupoles 410 and 412 are provided in the area of the Wien filter elements 110 and 112, respectively. As mentioned above, the Wien filter elements act in a focusing and dispersive manner in x-direction. Different thereto, the quadrupole elements have a focusing effect in x-direction but hardly any dispersive action. Within the embodiment of FIG. 5b the excitation of the Wien filter elements 110 and 112 is reduced. To compensate for the reduced focusing, the quadrupole elements 410 and 412 are excited. Thereby, the same focusing effect is realized. Since the quadrupole does not introduce dispersion (except of aberrations) the reduced dispersion, which is realized by decreasing the Wien filter excitation, is not compensated for. Thus, components which are easy to adjust and which include more flexible charged particle energy selection can be provided.

In x-direction, the beam path 11 of the nominal energy electrons remains the same as beam path 10. However, electrons deviating from the nominal energy $E_n$ have less deflection from the $E_n$-beam path 11. FIG. 5c shows a situation where the excitation of the Wien filter element is further decreased, whereas the quadrupole element excitation is further increased. Again, the reduced focusing action of the Wien filter element is compensated for, whereas the reduced dispersion of the Wien filter is not compensated for. Therefore, reference numbers 10e and 10f show beams which are even less deflected from the nominal beam 12.

To summarize: FIGS. 5a to 5c show situations wherein the dispersion in x-direction is decreased by substituting the focusing effect of the Wien filter elements with a focusing effect of the quadrupole elements. Thereby, two different effects can be realized.

On the one hand, in order to adjust the energy width of the electron beam, the electron energy dependent selection means does not need to be adjusted. Since the dispersion of the monochromator can be adjusted for example, a slit with a fixed selection width and a fixed position can be used.

On the other hand, having a monochromator with strong dispersion would result in blocking of many electrons. Thereby, the electron beam current is reduced. Consequently, making use of a monochromator, the primary electron energy width cannot be reduced without decreasing the electron beam current. There may be application where a high beam current is required. Then, the disclosed combination of Wien filter elements and quadrupole elements to adjust the dispersion and the beam current accordingly. Thus, the above described system can be used to flexibly adjust the dispersion and thereby the beam current or to flexibly adjust the beam current and thereby the dispersion, as desired.

FIG. 5d shows the respective beam paths 10, 11 and 12 in y-direction. The quadrupole elements 410 and 412 have a defocusing effect in y-direction. Thus, in y-direction, beam paths 11 and 12 deviate from beam path 10, even though the electrons have the nominal energy $E_n$. However, since focusing element 314 does not have any influence in x-direction, adjustments can be made without disturbing the imaging in x-direction. Thus, the defocusing introduced in quadrupole elements 410 and 412 in y-direction can be compensated for with focusing element 314.

In the above-described embodiments, the quadrupole elements acted focusingly in the x-z-plane to substitute a portion of the focusing effect of the Wien filter elements. However, according to a further embodiment, the quadrupole elements may act defocusingly in the x-z-plane. To obtain a desired focusing in the x-z-plane, the defocusing of the quadrupole elements would have to be overcompensated by the Wien filter elements. Thus, an even higher excitation of the Wien filter elements would be possible. This would result in an even further increased dispersion and energy width reduction.

Figure 12:
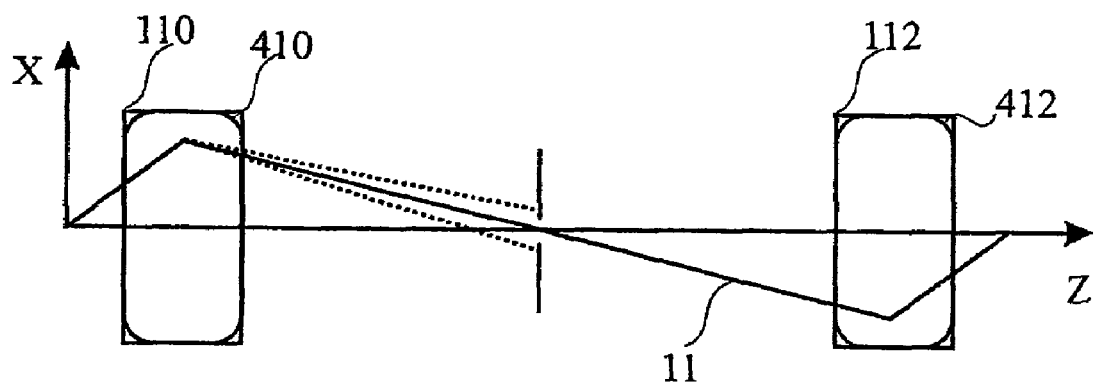
FIG. 12 shows a schematic side view of another embodiment.

The embodiment referred to a defocusing quadrupole in the x-z-plane would result in the y-z-plane in a focusing. Thus, the focusing effect of the focusing element in the y-z-plane could be reduced. In the case where the focusing of the quadrupole in the y-z-plane would generate an additional crossover, the focusing effect of the focusing element in the y-z-plane would have to be increased as compared to the embodiments shown in FIGS. 5a to 5d. With regard to such an embodiment, as an alternative, it is possible to adjust the focusing effect of the quadrupole elements in the y-z-plane such that no focusing element would be necessary for the desirable stigmatic imaging of the energy width reduction system. A respective example is shown in FIG. 12.

These advantageous characteristics can be better understood with respect to FIGS. 13a to 13h. Therein, the above-mentioned alternatives are summarized. In each of the FIG. 13, a first Wien filter element 110 and a second Wien filter element 112, as well as a first quadrupole element 410 and a second quadrupole element 412 is shown in a side-view of the y-z-plane. Essentially in the middle between these elements a focusing element 314 is provided. The dotted line 116 symbolizes the electron selection element 116, which selects electrons displaced from the optical axis in x-direction.

The system is arranged and the components are constructed so that symmetrical mechanical design with regard to the center plane of the system is obtained. In operation, this symmetry is maintained by a symmetric excitation of the above-described components.

Within FIGS. 13a to 13h, the focusing element 116, unless stated otherwise, can be any one selected from the group of: magnetic round lens, electrostatic round lens, compound electrostatic-magnetic round lens, a magnetic cylinder lens, an electrostatic cylinder lens, a magnetic quadrupole element, an electrostatic quadrupole element or any combination of all of these elements, especially a compound electrostatic-magnetic quadrupole element or a compound electrostatic-magnetic cylinder lens.

Within all FIGS. 13a to 13h, beam path 10 is shown as a reference. Beam path 10 is realized if the quadrupole elements 410 and 412 are not excited or are not present. Thereby, the electron would pass the Wien filter elements 110 and 112 without being influenced in the y-direction.

In the case where quadrupole elements 410 and 412 are provided and excited, the quadrupole element acts on the electrons in x-direction and y-direction. The focusing in x-direction (see FIGS. 5a to 5c) is realized by a combination of the Wien filter elements and the quadrupole elements. To realize the desired beam path in x-direction, a lower Wien filter element excitation can be compensated by a higher excitation of the quadrupole element. However, the excitation of the quadrupole also results in an imaging in y-direction. As mentioned above, FIGS. 13a to 13h summarized the possible alternatives.

Figure 13A:
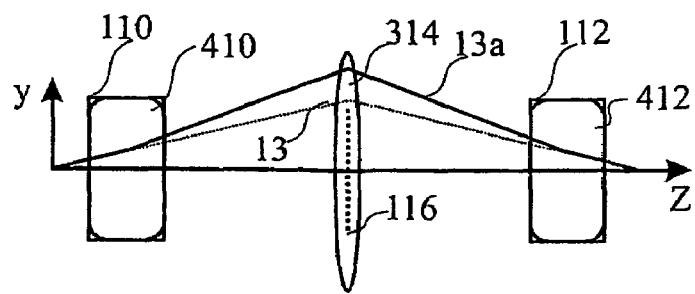
FIGS. 13a to 13h shows embodiments of the present invention, whereby the figures refer to increasing excitation of the Wien filter elements.

FIG. 13a shows an embodiment where the Wien filter excitation is reduced as compared to the excitation corresponding to beam path 13. Thus, the focusing action in x-direction of the Wien filter element and the dispersion of the Wien filter element are also reduced. In order to still obtain the desired beam path in the x-z-plane, the quadrupole is excited to focus in x-direction. This results in a defocusing of the quadrupole in y-direction as can be seen by beam path 13a in FIG. 13a. Utilizing the excitation corresponding to FIG. 13a, the dispersion of the system is reduced as compared to the excitation corresponding to beam path 13. At the same time the beam current is increased.

Starting from FIG. 13a, the excitation of the Wien filter elements 110 and 112 can be continuously increased. Thereby, the dispersion of the monochromator increases and the beam current of the system decreases. FIGS. 13b to 13h show step by step the resulting beam paths while the Wien filter element excitation increases.

Figure 13B:
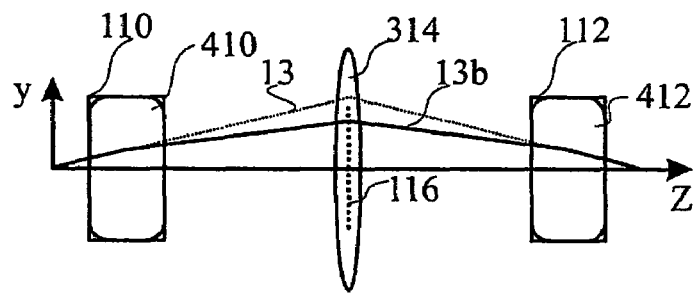

Firstly, on increase of the Wien-filter excitation, a beam path corresponding to beam path 13 can be realized. Further increasing the Wien-filter excitation results in an embodiment according to FIG. 13b. FIG. 13b shows an embodiment where the Wien filter excitation is increased as compared to the excitation corresponding to beam path 13. Thus, the focusing action in x-direction of the Wien filter element and the dispersion of the Wien filter element are also increased. In order to still obtain the desired beam path in the x-z-plane, the quadrupole is excited to defocus in x-direction. This results in a focusing of the quadrupole in y-direction as can be seen by beam path 13b in FIG. 13b. Utilizing the excitation corresponding to FIG. 13b, the dispersion of the system is increased as compared to the excitation corresponding to beam path 13. At the same time the beam current is reduced.

Figure 13C:
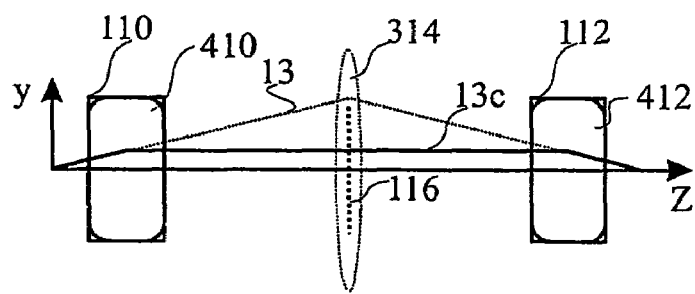

A further increase of the excitation of the Wien filter elements results in an embodiment corresponding to FIG. 13c. In FIG. 13c the beam is focused in the y-direction by quadrupole element 410 to pass parallel to the optical axis. Accordingly, a symmetric beam path regarding the x-y-center plane of the system is realized without any focusing of focusing element 314. Therefore, the focusing element is symbolized with dotted lines. This is to be understood as either an unexcited focusing element or as a deletion of the focusing element from the system.

Figure 13D:
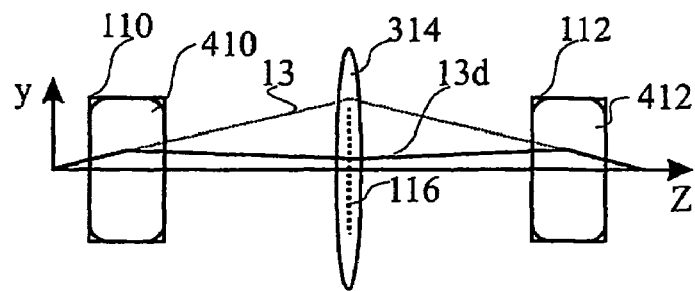

A further increase of the excitation of the Wien filter elements results in an embodiment corresponding to FIG. 13d. Thus, the focusing action in x-direction of the Wien filter element and the dispersion of the Wien filter element are also increased. In order to still obtain the desired beam path in the x-z-plane, the quadrupole is excited to defocus in x-direction. This results in a focusing of the quadrupole in y-direction as can be seen by beam path 13d in FIG. 13d. Utilizing the excitation corresponding to FIG. 13d, the dispersion of the system is further increased as compared to the excitation corresponding to beam path 13c. At the same time the beam current is reduced.

In contrast to the embodiments shown above, the focusing element 314 of FIG. 13d needs to defocus the electron beam. Thus, focusing element 314 as used in the embodiment of FIG. 13d needs to be a quadrupole element.

Figure 13E:
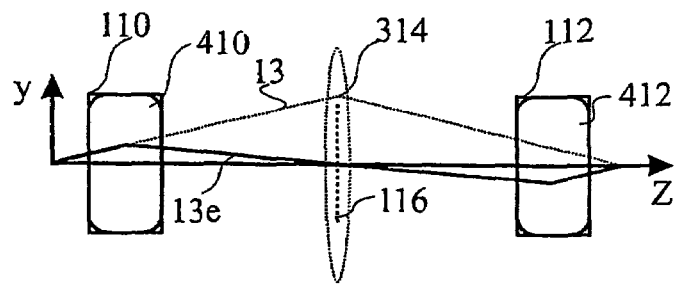

A further increase of the excitation of the Wien filter elements results in an embodiment corresponding to FIG. 13e.

Comparable to the embodiment of FIG. 13c, the excitation conditions of FIG. 13e do not require a focusing element 314. However, contrary to the embodiment of FIG. 13e, a focusing element would not be harmful in FIG. 13e, since electron beam path 13e passes through the center of the optional focusing element. Thus, in FIG. 13e, the focusing element drawn with dotted lines can either be switched on, can be switched off, or need not to be present in the system.

Figure 13F:
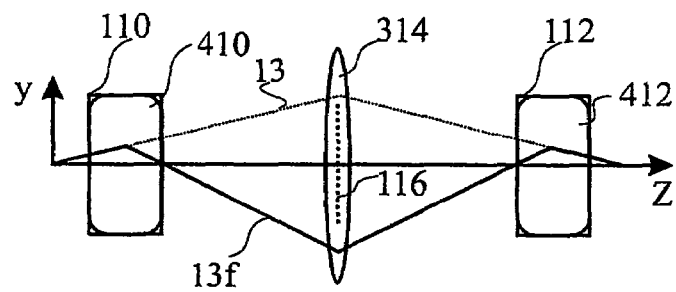

Without going into great detail, a further increase of the excitation of the Wien filter elements results in a beam path 13f as shown in FIG. 13f. Thereby, an arbitrary focusing element focusing in the y-z-plane is required for an essentially symmetric beam path.

Figure 13G:
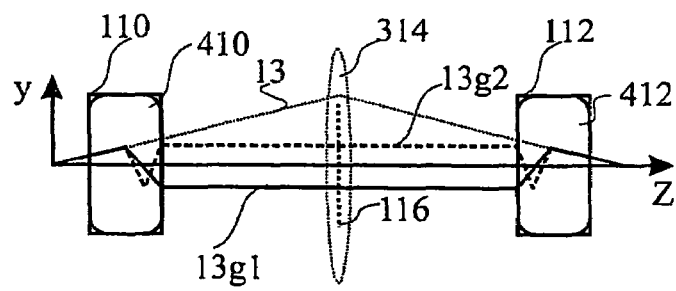
Figure 13H:
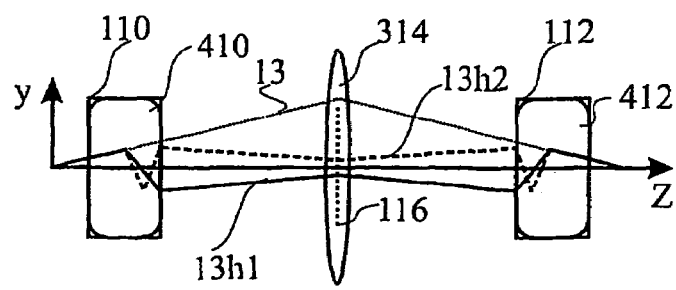

FIGS. 13g and 13h show embodiments with even further increased Wien filter element excitation. Thereby, higher order beam paths are realized in the Wien filter elements 110 and 112. The beam paths shown correspond to increasing Wien filter element excitation in the following order: 13g1, 13h1, 13g2 and 13h2.

These higher order beam paths can also be explained as follows. In spite of an increased excitation of the Wien filter elements the combined focusing of the Wien filter element and the quadrupole element is kept constant. Thus, the dispersion can be increased without being negatively influenced by the focusing action. Therefore, an inherent limitation of dipole Wien filters can be overcome. These limitations are described in greater detail in a corresponding patent application, PCT/EP04/09796, filed together with this application.

Details regarding the focusing elements 314 are similar to the details provided with respect to FIGS. 13a to 13f.

To summarize the embodiments shown in FIGS. 13a to 13h, generally, a continuous increase of the Wien filter excitation can be realized. Thereby, the dispersion can—without an inherent limit conditional upon the focusing properties of the Wien filter—be continuously increased without variation of the electron selection element 116.

There are a plurality of discrete excitation values that does not require a focusing element 314. Thus, the advantageous variation of the dispersion without variation of the electron selection element can also be realized with a monochromator not utilizing a focusing element 314 if, between the Wien filter elements, a beam path parallel to the optical axis or a beam path with a crossover essentially in the middle of the Wien filter elements is realized. Thereby, a set of excitation values selected from a plurality of sets of discrete excitation values for the Wien filter elements and quadrupole elements is used.

Figure 6:
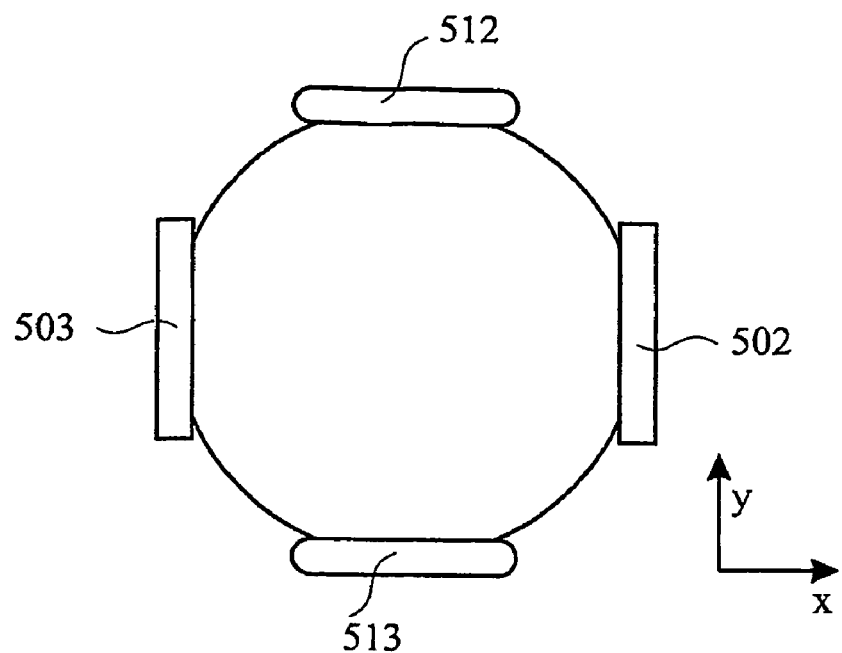
FIG. 6 shows a schematic view of an embodiment of a multipole element according to the present invention.

FIGS. 6 to 9 show different embodiments of the Wien-filter elements 110, 112 as well as the Wien filter elements and the quadrupole elements 410, 412. The views are in direction of the z-axis. In FIG. 6 there are electrostatic poles 502 and 503. These poles are used to generate an electric field in x-direction. Magnetic poles 512 and 513, which are generally excited by coils, are used to generate a magnetic field in y-direction. The poles 502, 503, 512 and 513 form a dipole Wien filter element.

Figure 7:
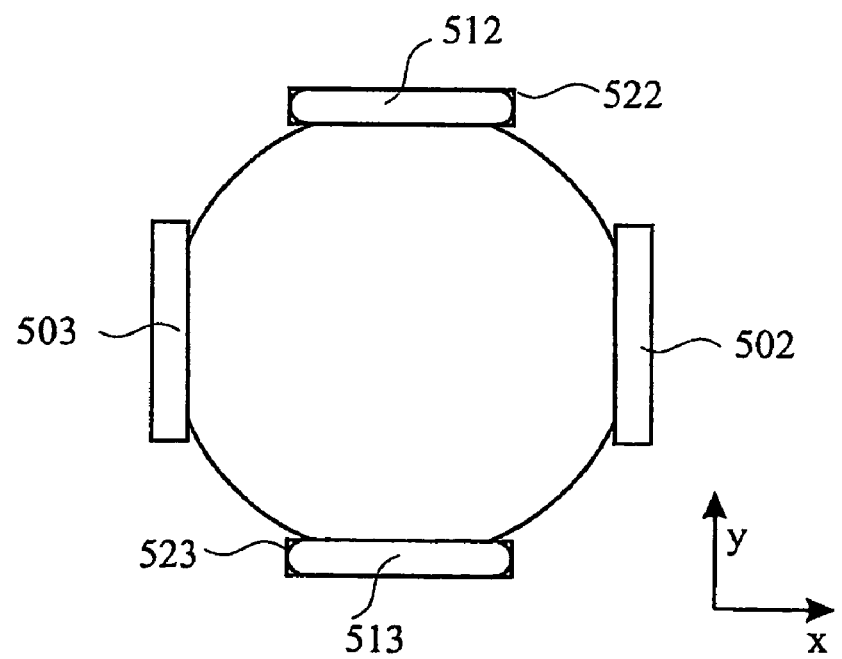
FIG. 7 shows a schematic view of an embodiment of a multipole element according to the present invention.

The embodiment of FIG. 7 comprises the elements of the Wien filter described above. Additionally, electrostatic poles 522 and 523 are provided. These electrostatic poles 522 and 523 form together with electrostatic poles 502 and 503 an electrostatic quadrupole, which can be used as a focusing and quasi-non-dispersive element partly substituting the focusing of the Wien filter element. Within the embodiment of FIG. 6 the Wien filter element and the quadrupole element share poles. Thus, these two elements are provided as one component.

In an alternative embodiment (not shown) the electrostatic poles of the Wien filter element and the electrostatic poles of the electrostatic quadrupole element can be separated. In such a case, the Wien filter element and the electrostatic quadrupole element would be considered as two separate components. A possible separation of the poles for the Wien filter element and the quadrupole element can be more easily understood with reference to FIG. 8.

Figure 8:
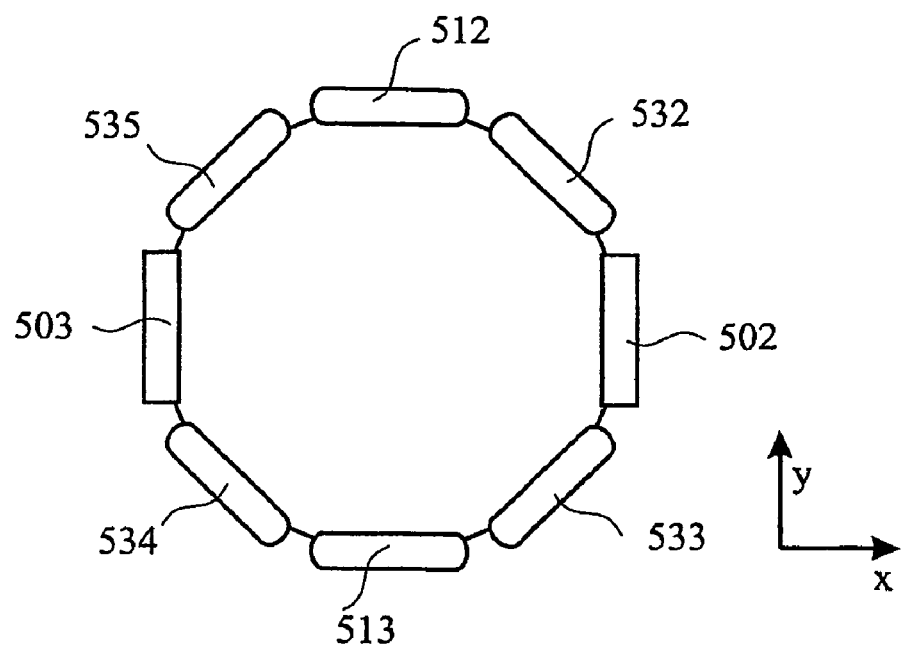
FIG. 8 shows a schematic view of an embodiment of a multipole element according to the present invention.

FIG. 8 shows an embodiment with a dipole Wien filter element (502, 503, 512, 513) and a magnetic quadrupole 532 to 535. In order to generate a focusing in x-direction and a defocusing in y-direction with the magnetic quadrupole element, the poles of the magnetic quadrupole are rotated by 45° as compared to the poles of the Wien filter element. In the case of FIG. 8, two possibilities can be realized; namely to provide one multipole including the Wien filter element and the quadrupole element or to provide two components.

Figure 9:
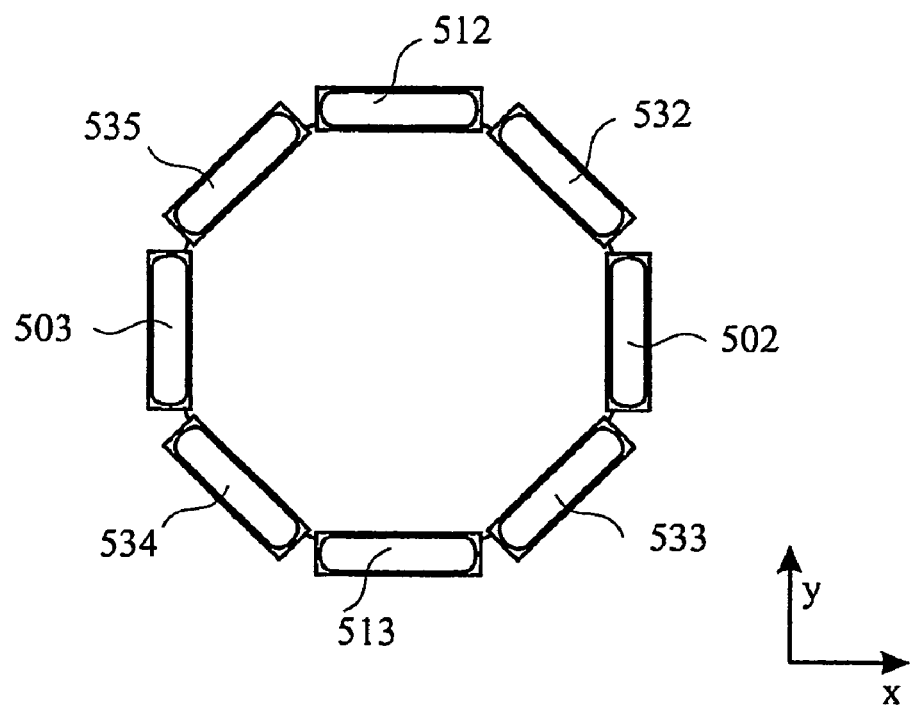
FIG. 9 shows a schematic view of an embodiment of a multipole element according to the present invention.

FIG. 9 shows an illustration of an embodiment for a combined electrostatic magnetic multipole. Thereby, two electrostatic and two magnetic poles form a dipole Wien filter. Further, an electrostatic and/or magnetic quadrupole field can be generated. Additionally, higher order multipole fields can be generated in order to compensate for aberrations introduced during any imaging of a charged particle beam on a specimen. Additional dipole fields may be generated in order to deflect the beam.

With reference to FIGS. 1 to 9, different embodiments and individual details thereof have been described. It has been shown that two Wien filter elements, one focusing element and one electron selection element, can be combined. Different exemplary embodiments of electron selection elements and of focusing elements have been mentioned. Further, an alternative embodiment including two further quadrupole elements has been described. Still, different embodiments of a Wien filter element, quadrupole elements, combinations thereof and multipole elements have been disclosed in general. Unless mutually exclusive, the described details can be combined with each other, independent of the specific embodiments.

In order to provide some exemplary combination of the above-mentioned details, FIGS. 10a to 10f show six embodiments. All figures show a schematic view in the x-z-plane. These embodiments give examples of how the individual details can be combined. The present invention is not to be limited to those examples.

Figure 10A:
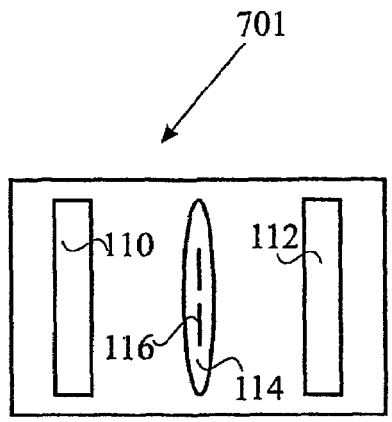
FIGS. 10a to 10f show schematic side views of embodiments of electron beam energy width reduction systems according to the present invention.

FIG. 10a shows an optical system 701 comprising a first Wien filter element 110, a second Wien filter element 112. Further, an electron energy dependent selection element 116 is provided between the two Wien filter elements. The distance in z-direction of the electron selection element 116 is essentially similar to each of the two Wien filter elements. The electron energy dependent selection element has an opening according to any embodiment shown in FIGS. 2a to 2e or another shape which is appropriate for selecting electrons. For further details, please refer to FIGS. 2a to 2e. Focusing element 114 is located at essentially the same z-position as electron selection element 116.

Figure 10B:
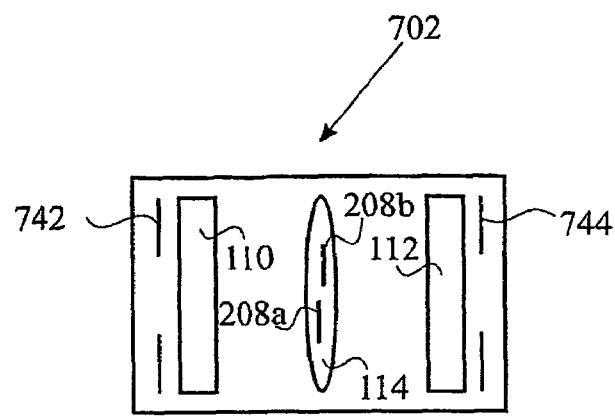

FIG. 10b shows an optical system 702. Again, there are two Wien filter elements 110 and 112. The focusing element 114 can be, like in all other embodiments, any element of the group of a magnetic round lens, electrostatic round lens; compound electrostatic-magnetic round lens, a magnetic cylinder lens, an electrostatic cylinder lens, a magnetic quadrupole element, an electrostatic quadrupole element or any combination of all of these elements. However, the shape of element 114 used in FIG. 10b, is to be understood as symbolizing a round lens. FIG. 10b shows a combination of elements 208a and 208b to select the electrons. The usage of elements 208a and 208b has been described in more detail with reference to FIGS. 3a and 3b. Additionally, two apertures or electron angle depending selection elements 742 and 744 are provided. Aperture 742 blocks a portion of the incoming electron beam, whereas aperture 744 blocks a portion of the outgoing electron beam. These apertures can be used for limiting the distance of the electrons from the optical axis in order to control the aberrations that might be introduced.

Figure 10C:
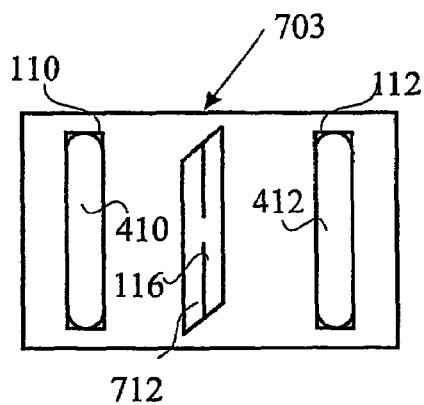

Within FIG. 10c, an embodiment 702 with a combined Wien filter—quadrupole element 110/410 is shown. The further combined element 112/412 is positioned so that focusing element 712 is located in the middle (along z-axis) of the two Wien filter elements. Again, an electron energy dependent selection element 116 is used substantially at the same z-position as the focusing element 712. Focusing element 712 illustrates a cylinder lens. It is preferred if lens 712 only acts in y-direction. However, some misalignment might not be avoidable. Cylinder lens 712 can either be magnetic, electrostatic, or combined magnetic-electrostatic. However, it is further preferred if lens 712 comprises at least an electrostatic component which acts in deceleration mode (decel mode). Thereby, the electrons are decelerated and the dispersion is increased.

Figure 10D:
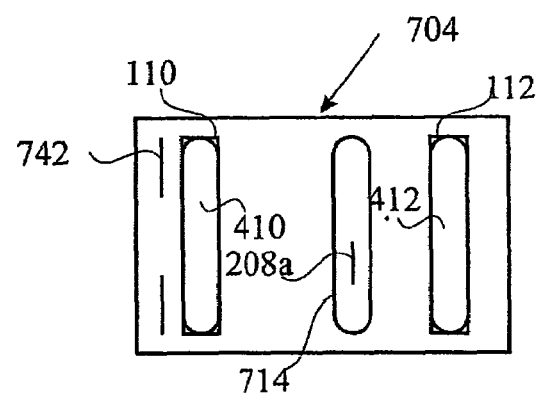

FIG. 10d shows an optical system 704, including aperture 742, Wien filter elements 110 and 112, quadrupole elements 410 and 412 and electron selection element 208a As described with respect to FIGS. 3a and 3b, the electron selection edge 208a only blocks electrons on one side of the energy spectrum of the primary electron beam. As a focusing element with imaging properties focusing essentially in y-direction, a quadrupole 714 is used. As an alternative, electron selection element 208a and focusing element 714 are displaced from the center x-y-plane of the system. Such a position negatively influences the symmetry properties of the energy width reduction system. However, for manufacturing reasons or the like, such an arrangement might be considerable. The position of electron selection element 208a and focusing element 714, even though not preferred, might be combined with any of the other embodiments.

Figure 10E:
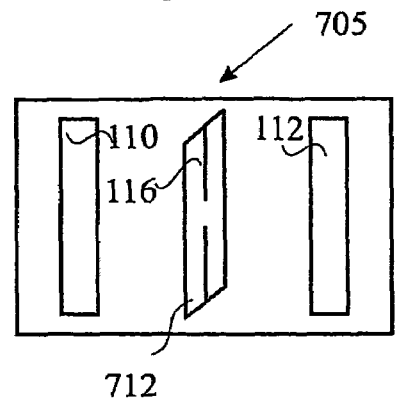

FIG. 10e combines the optical system 705 described in FIG. 1 with the cylinder lens described in FIG. 10c. It is preferred if lens 712 only acts in y-direction. Cylinder lens 712 can either be magnetic, electrostatic, or combined magnetic-electrostatic. However, it is preferred if lens 712 comprises at least an electrostatic component which acts in deceleration mode.

Figure 10F:
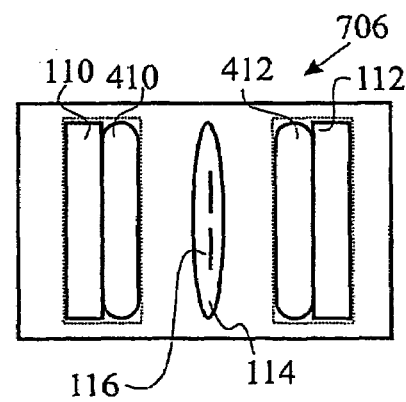

A further exemplary embodiment is shown in FIG. 10f. Therein, optical system 706 is shown. The optical system has focusing element 114 and energy selection element 116. The dispersion and the focusing in x-direction is conducted by means 110/410 and means 112/412 respectively. Elements 110 and 112 are Wien filters, whereas elements 410 and 412 are quadrupole elements.

The respective pairs of Wien filters and quadrupoles are displaced with respect to each other in z-direction. The dotted lines indicate that they can either be combined in one component or can be realized as separate components.

Independent of specific embodiments shown in the present application, the fields of the Wien filter element and the respective quadrupole element can either substantially overlap, can partly overlap or can act in different regions. If the fields partly overlap, it is possible that one of the fields has a smaller extension in z-direction and is positioned symmetrically to the other field. However, the two fields could also have essentially the same extension in z-direction and be displaced in z-direction. Nevertheless, it is preferred in any case if the elements on the left side of the focusing element (114, 314, 712, 714) and the elements on the right side of the focusing element are arranged symmetrically in z-direction with respect to the focusing element. That is, the elements of the monochromator are typically mechanically designed and arranged to be essentially symmetrical with regard to the center x-y-plane of the system.

Figure 11:
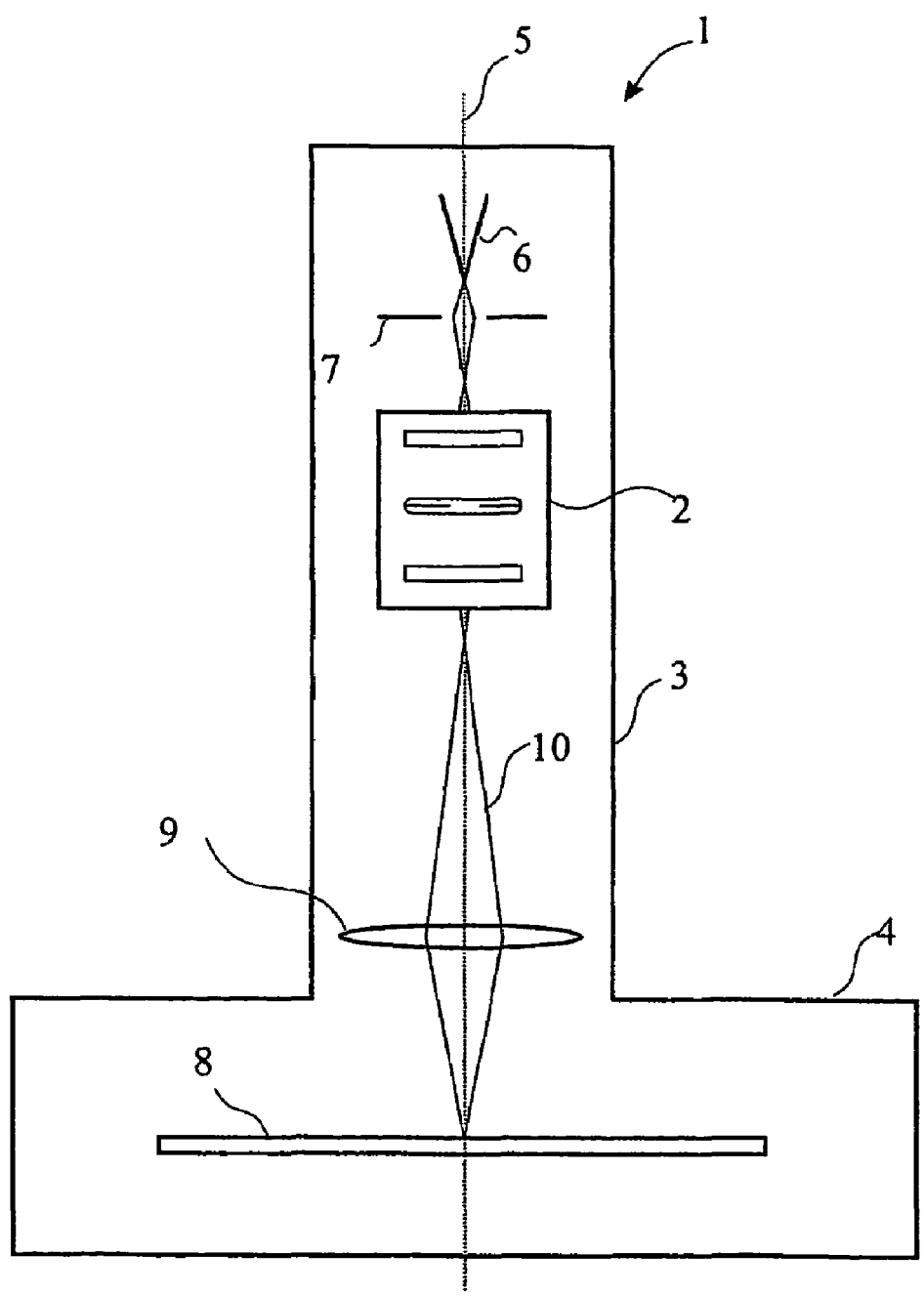
FIG. 11 shows a schematic side view of an embodiment of an electron beam device making use of a charged particle beam energy width reduction system according to the present invention.

In the following, one example of using the optical system for reducing the energy width of the primary electron beam is given. FIG. 11 shows an electron beam column 1. The electron beam column comprises a column housing 3 and a specimen chamber 4. Specimen 8 is located in the specimen chamber. Emitter unit 6 emits electron beam 10 along optical axis 5. Lens 7 illuminates monochromator 2, which selects the electrons dependent on the electron energy. Thereby, the energy width of the primary electron beam can be reduced. Thus, the chromatic aberration introduced in objective lens 9 can be reduced and the resolution of the system can be increased.

Generally it is preferred if the lens 7 acts as a magnification lens. Having a magnified image the electron selection can be conducted more easily.

Even though an example for a monochromator 2 is shown in FIG. 11, all disclosed variations of the monochromator (e.g. FIGS. 10a to 10f and the like) can be used in the electron beam column 1. Further, the position of the monochromator in the electron beam column can be varied. Generally, without limiting the invention thereto, it is preferred if the monochromator is located close to the emitter unit 6.

The invention claimed is:

1. Charged particle beam energy width reduction system for a charged particle beam with a z-axis along an optical axis, comprising
a first element acting in a focusing and dispersive manner in an x-z-plane, being a first Wien filter, and having a first z-position $z_1$;
a second element acting in a focusing and dispersive manner in the x-z-plane, being a second Wien filter, and having a second z-position $z_2$;
a charged particle selection element with a z-position between $z_1$ and $z_2$;
a focusing element with a z-position between $z_1$ and $z_2$, wherein the charged particle selection element has substantially the same z-position as the focusing element, and wherein the charged particle selection element is adapted to be a charged particle energy dependent selection element.

2. Charged particle beam energy width reduction system according to claim 1, wherein the z-positions of the charged particle selection element and the focusing element are essentially the middle of the z-positions $z_1$ and $z_2$.

3. Charged particle beam energy width reduction system according claim 1, wherein the charged particle selection element is a slit.

4. Charged particle beam energy width reduction system according to claim 1, wherein the charged particle selection element has at least one property selected from the group consisting of a variable selection width and a variable position.

5. Charged particle beam energy width reduction system according to claim 1, wherein the charged particle selection element has at least one property selected from the group consisting of a fixed selection width and a fixed position.

6. Charged particle beam energy width reduction system according to claim 1, wherein the charged particle selection element comprises a knife edge.

7. Charged particle beam energy width reduction system according to claim 1, wherein the focusing element is suitable for focusing in a y-z-plane.

8. Charged particle beam energy width reduction system according to claim 7, wherein the focusing element is an astigmatic focusing element, suitable for focusing in the y-z-plane and defocusing or not focusing in the x-z-plane.

9. Charged particle beam energy width reduction system according to claim 3, wherein the slit of the energy selection element extends essentially in a y-direction.

10. Charged particle beam energy width reduction system according to claim 8, wherein the focusing element includes an electrostatic cylinder lens in decel mode.

11. Charged particle beam energy width reduction system according to claim 8, wherein the focusing element includes an electrostatic quadrupole in decel mode.

12. Charged particle beam energy width reduction system according to claim 1, wherein the focusing element is suitable for focusing stigmatically and the projection of the charged particle beam in the x-z-plane crosses the optical axis of the charged particle beam energy width reduction system in the center of the focusing element.

13. Charged particle beam energy width reduction system according to claim 12, wherein the focusing element includes an electrostatic round lens in decel mode.

14. Charged particle beam energy width reduction system according to claim 1, further comprising: a first quadrupole element; and a second quadrupole element.

15. Charged particle beam energy width reduction system according to claim 14, wherein the first quadrupole element acts in a focusing or defocusing manner in the x-z-plane, and the second quadrupole element acts in a focusing or defocusing manner in the x-z-plane.

16. Charged particle beam energy width reduction system according to claim 15, wherein the first quadrupole element is positioned so that the field of the first quadrupole element essentially superimposes with the field of the first element acting in a focusing and dispersive manner; and the second quadrupole element is positioned so that the field of the second quadrupole element essentially superimposes with the field of the second element acting in a focusing and dispersive manner.

17. Charged particle beam energy width reduction system according to claim 16, wherein the first element acting in a focusing and dispersive manner and the first quadrupole element are formed by one multipole element and the second element acting in a focusing and dispersive manner and the second quadrupole element are formed by one multipole element.

18. Charged particle beam energy width reduction system according to claim 17, wherein additional deflection or aberration correction elements are superimposed in the multipole elements.

19. Charged particle beam energy width reduction system according to claim 1, wherein the charged particle beam reduction system is a straight vision system.

20. Charged particle beam energy width reduction system according to claim 19, wherein the energy width reduction system is an energy width reduction system for a primary charged particle beam.

21. Charged particle beam energy width reduction system according to claim 1, wherein the charged particle beam energy width reduction system is a retarding field energy width reduction system.

22. Charged particle beam device comprising a charged particle beam energy width reduction systems according to claim 1.

23. Charged particle beam device according to claim 22, wherein a magnification lens illuminates the charged particle beam energy width reduction system.

24. Charged particle beam energy width reduction system positioned prior to an objective lens for a charged particle beam with a z-axis along an optical axis, comprising:
   a first element acting in a focusing and dispersive manner in an x-z-plane, being a first Wien filter, and having a first z-position $z_1$;
   a second element acting in a focusing and dispersive manner in the x-z-plane, being a second Wien filter, and having a second z-position $z_2$;
   a charged particle selection element with a z-position between $z_1$ and $z_2$;
   a focusing element with a z-position between $z_1$ and $z_2$,
   wherein the charged particle selection element has substantially the same z-position as the focusing element.

25. Charged particle beam energy width reduction system according claim 24, wherein the charged particle selection element is a slit.

26. Charged particle beam energy width reduction system according to claim 24, wherein the charged particle selection element comprises a knife edge.

27. Charged particle beam energy width reduction system according to claim 24, wherein the focusing element is suitable for focusing in a y-z-plane.

28. Charged particle beam energy width reduction system according to claim 27, wherein the focusing element includes an electrostatic cylinder lens in decel mode.

29. Charged particle beam energy width reduction system according to claim 27, wherein the focusing element includes an electrostatic quadrupole in decel mode.

30. Charged particle beam energy width reduction system according to claim 24, wherein the focusing element is suitable for focusing stigmatically and the projection of the charged particle beam in the x-z-plane crosses the optical axis of the charged particle beam energy width reduction system in the center of the focusing element.

31. Charged particle beam energy width reduction system according to claim 30, wherein the focusing element includes an electrostatic round lens in decel mode.

32. Charged particle beam energy width reduction system according to claim 24, further comprising:
   a first quadrupole element; and
   a second quadrupole element, wherein the first quadrupole element acts in a focusing or defocusing manner in the x-z-plane; and wherein the second quadrupole element acts in a focusing or defocusing manner in the x-z-plane.

33. Charged particle beam energy width reduction system according to claim 32, wherein the first element acting in a focusing and dispersive manner and the first quadrupole element are formed by one multipole element and the second element acting in a focusing and dispersive manner and the second quadrupole element are formed by one multipole element.

34. Charged particle beam energy width reduction system according to claim 24, wherein the energy width reduction system is an energy width reduction system for a primary charged particle beam.

35. Charged particle beam energy width reduction system according to claim 24, wherein the charged particle beam energy width reduction system is a retarding field energy width reduction system.

36. Charged particle beam energy width reduction system with a z-axis along an optical axis comprising:
   a first element acting in a focusing and dispersive manner in a x-z-plane, being a first Wien filter element, and having a first z-position $z_1$;
   a second element acting in a focusing and dispersive manner in the x-z-plane, being a second Wien filter element, and having a second z-position $z_2$;
   a charged particle selection element with a z-position essentially in the middle of $z_1$ and $z_2$;
   a first quadrupole element acting in a defocusing manner in the x-z-plane;
   a second quadrupole element acting in a defocusing manner in the x-z-plane;
   wherein the first element acting in a focusing and dispersive manner, the second element acting in a focusing and dispersive manner, the first quadrupole element, the second quadrupole element, and the charged particle selection element are positioned to allow a stigmatic and dispersion-free imaging of the trespassing charged particles, and wherein the charged particle selection element is adapted to be a charged particle energy dependent selection element.

37. Charged particle beam energy width reduction system according to claim 36 wherein the first and the second elements acting in a focusing and dispersive manner have essentially a symmetrical position with regard to the center plane of the system; and wherein the first and the second quadrupole elements have essentially a symmetrical position with regard to the center plane of the system.

38. Charged particle beam energy width reduction system according to claim 36, further comprising:
   a focusing element with a z-position between $z_1$ and $z_2$; and
   wherein the first element acting in a focusing and dispersive manner, the second element acting in a focusing and dispersive manner, the first quadrupole element, the second quadrupole element, the charged particle selection element, and the focusing element are positioned to allow a stigmatic and dispersion-free imaging of the trespassing charged particles.

39. Method of operating a charged particle beam energy width reduction system for a charged particle beam comprising a z-axis along an optical axis, comprising:
   providing a first element acting in a focusing and dispersive manner in a x-z-plane, being a first Wien filter element, at a z-position $z_1$;
   providing a second element acting in a focusing and dispersive manner in the x-z- plane, being a second Wien filter element, at a z-position $z_2$;
   providing a charged particle selection element with a z-position between $Z_1$ and $z_2$; and
   providing a focusing element at substantially the same z-position as the charged particle selection element;
   exciting the first element acting in a focusing and dispersive manner so that charged particles with a nominal energy pass through the charged particle selection element and the center of the focusing element;
   exciting the second element acting in a focusing and dispersive manner;
   exciting the focusing element so that an essentially stigmatic imaging is obtained, and
   selecting charged particles with the charged particle selection element.

40. Method of operating a charged particle beam energy width reduction system for a charged particle beam according to claim 39, further comprising:
   exciting a first quadrupole element to substitute a desired portion of the focusing effect of the first element acting in a focusing and dispersive manner and exciting a second quadrupole element to substitute a desired portion of the focusing effect of the second element acting in a focusing and dispersive manner.

41. Method of operating a charged particle beam energy width reduction system for a charged particle beam according to claim 40, further comprising:
adjusting the dispersion depending on the excitation of the elements acting in a focusing and dispersive manner in relation to the excitation of the quadrupole elements.

42. Method of operating a charged particle beam energy Width reduction system for a charged particle beam according to claim 39, further comprising:
adjusting a beam current depending on the excitation of the elements acting in a focusing and dispersive manner in relation to the excitation of quadrupole elements.

43. Method of operating a charged particle beam energy width reduction system for a charged particle beam according to claim 39, wherein the charged particle selection element is provided with a z-position essentially acting in a focusing and dispersive manner is excited to obtain an essentially symmetric imaging in the x-z-plane.

44. Method of operating a charged particle beam energy width reduction system for a charged particle beam, comprising a z-axis along an optical axis, a first element acting in a focusing and dispersive manner, being a first Wien filter element, at a z-position $z_1$, a second element acting in a focusing and dispersive manner, being a second Wien filter element, at a z-position $z_2$, a charged particle selection element, a first quadrupole element, and a second quadrupole element, comprising:
exciting the first Wien filter to act in a focusing and dispersive manner in a x-z-plane so that charged particles with a nominal energy pass through the energy selection element;
exciting the second Wien filter to act in a focusing and dispersive manner in the x-z-plane;
exciting the first and the second quadrupole elements to act in an imaging manner in the x-z-plane; and
selecting charged particles with the charged particle selection element essentially in the middle of $z_1$ and $z_2$.

45. Method of operating a charged particle beam energy width reduction system for a charged particle beam according to claim 44, wherein the first Wien filter element and the second Wien filter element are excited so that the combination of the field of the first Wien filter element and the field of the second Wien filter element result in an essentially symmetric imaging in the x-z-plane; and exciting the first and the second quadrupole element so that the combination of the field of the first quadrupole element and the field of the second quadrupole element result in an essentially symmetric imaging in a y-z-plane.

46. Method of operating a charged particle beam energy width reduction system for a charged particle beam according to claim 45 further comprising: exciting the first and the second Wien filter elements and the first and the second quadrupole elements so that a stigmatic imaging is obtained.

47. Method of operating a charged particle beam energy width reduction system for a charged particle beam according to claim 44, further comprising the step of:
exciting a focusing element positioned between $z_1$ and $z_2$ so that an essentially stigmatic imaging is obtained.

48. Method of operating a charged particle beam energy width reduction system for a charged particle beam according to claim 44, further comprising: exciting a first quadrupole element to obtain a desired focusing effect combined of the first quadrupole element charged particle beam deflection and the first Wien filter element charged particle beam deflection and exciting a second quadrupole element to obtain a desired focusing effect combined of the second quadrupole element charged particle beam deflection and the second Wien filter element charged particle beam deflection; wherein the desired focusing effect is defined by a beam path so that the charged particles with a nominal energy pass through the energy selection element.

49. Method of operating a charged particle beam energy width reduction system for a charged particle beam according to claim 44, wherein the first and second elements acting in a focusing and dispersive manner and the first and second quadrupole elements are excited to one of a plurality of discrete values.

* * * * *

UNITED STATES PATENT AND TRADEMARK OFFICE
CERTIFICATE OF CORRECTION

PATENT NO. : 7,507,956 B2
APPLICATION NO. : 10/571346
DATED : March 24, 2009
INVENTOR(S) : Frosien et al.

It is certified that error appears in the above-identified patent and that said Letters Patent is hereby corrected as shown below:

Column 1, Line 58, please delete "farther" and insert --further-- therefor;

Column 1, Line 65, please delete "When" and insert --Wien-- therefor;

Column 9, Line 64, please delete "night" and insert --might-- therefor;

Column 21, Claim 41, Line 11, please delete "Width" and insert --width-- therefor.

Signed and Sealed this

Thirtieth Day of June, 2009

JOHN DOLL
*Acting Director of the United States Patent and Trademark Office*